(12) United States Patent
Han et al.

(10) Patent No.: US 12,219,707 B2
(45) Date of Patent: Feb. 4, 2025

(54) CONNECTION MEMBER AND DISPLAY DEVICE INCLUDING SAME

(71) Applicant: Samsung Display Co., LTD., Yongin-si (KR)

(72) Inventors: Kyu Min Han, Seosan-si (KR); Seung Hwan Cheong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/223,245

(22) Filed: Jul. 18, 2023

(65) Prior Publication Data

US 2023/0363091 A1    Nov. 9, 2023

Related U.S. Application Data

(63) Continuation of application No. 17/389,564, filed on Jul. 30, 2021, now Pat. No. 11,751,331.

(30) Foreign Application Priority Data

Mar. 12, 2021  (KR) .......................... 10-2021-0032661

(51) Int. Cl.
*H05K 1/11* (2006.01)
*H05K 1/02* (2006.01)

(52) U.S. Cl.
CPC ............ *H05K 1/118* (2013.01); *H05K 1/0218* (2013.01); *H05K 2201/0715* (2013.01); *H05K 2201/10128* (2013.01)

(58) Field of Classification Search
CPC ...... H05K 1/118; H05K 1/0298; H05K 1/189; H05K 1/0218; H05K 2201/0715; H05K 2201/10128
See application file for complete search history.

(56) References Cited

U.S. PATENT DOCUMENTS 9,668,346 B2 *  5/2017  Shirao ................... H05K 1/118
10,057,990 B2    8/2018  Muro et al.

FOREIGN PATENT DOCUMENTS

| KR | 101498140 B1 | 3/2015 |
| KR | 1020200019534 A | 2/2020 |
| KR | 102154193 B1 | 9/2020 |

* cited by examiner

*Primary Examiner* — James Wu
(74) *Attorney, Agent, or Firm* — CANTOR COLBURN LLP

(57) ABSTRACT

A connection member includes a first region, a second region, and a third region, where a number of conductive layers in the second region is greater than a number of conductive layers in the first region and is greater than a number of conductive layers in the third region, a first layer, which is an uppermost layer of the second region, extends to the third region, a second layer, which is a lowermost layer of the third region, extends to the second region, and a side portion of the second region at a boundary between the second region and the third region is covered by the first layer and the second layer.

30 Claims, 12 Drawing Sheets

CONNECTION MEMBER AND DISPLAY DEVICE INCLUDING SAME

This application is a continuation of U.S. patent application Ser. No. 17/389,564, filed on Jul. 30, 2021, which claims priority to Korean Patent Application No. 10-2021-0032661, filed on Mar. 12, 2021, and all the benefits accruing therefrom under 35 U.S.C. § 119, the content of which in its entirety is herein incorporated by reference.

BACKGROUND (a) Field

The disclosure relates to a connection member and a display device including the connection member.

(b) Description of the Related Art

Various display devices that provide multimedia such as televisions, mobile phones, navigation aids, computer monitors, game consoles, etc. are being developed.

Such display devices typically include a display panel that displays an image and a body part that supplies power or signals to drive the display panel.

The display panel and the body part may be connected by a connection member. In such display device, the connection member may include a multi-layered conductive layer to stably supply the power and the signals from the body part to the display panel.

SUMMARY

Embodiments relate to a connection member and a display device including the connection member, in which lifting and moisture permeation are prevented, while improving aesthetics.

An embodiment of a connection member according to the invention includes a first region, a second region, and a third region, where a number of conductive layers in the second region is greater than a number of conductive layers in the first region and is greater than a number of conductive layers in the third region, a first layer, which is an uppermost layer of the second region, extends to the third region, a second layer, which is a lowermost layer of the third region is extended to the second region, and a side portion of the second region at a boundary between the second region and the third region is covered by the first layer and the second layer.

In an embodiment, the second region may include: a first conductive layer in contact with the first layer; a first insulating layer disposed opposite to the first layer with the first conductive layer therebetween; a fifth conductive layer in contact with the second layer; and a fourth insulating layer disposed opposite to the second layer with the fifth conductive layer therebetween, where the first insulating layer and the fourth insulating layer may extend to the third region, a side portion of the first insulating layer may be covered by the first layer, and a side portion of the fourth insulating layer is covered by the second layer.

In an embodiment, the second region may further include: a second conductive layer, a third conductive layer, and a fourth conductive; a second insulating layer disposed between the second conductive layer and the third conductive layer; and a third insulating layer disposed between the third conductive layer and the fourth conductive layer, where the first conductive layer to the fifth conductive layer may be connected to each other by a plurality of vias.

In an embodiment, the first layer may be an insulating layer including a black material.

In an embodiment, the second layer may be one selected from an insulating layer including a black material, a shielding film, and a stacked member of the insulating layer including the black material and the shielding film.

In an embodiment, the second layer may be one selected from an insulating layer including a black material, a shielding film, and a stacked member of the insulating layer including the black material and the shielding film.

In an embodiment, the first layer is a stacked member of an insulating layer including a black material and a shielding film.

In an embodiment, the second layer may be one selected from an insulating layer including a black material, a shielding film, and a stacked member of the insulating layer including the black material and the shielding film.

In an embodiment, a pad part, which is connected to a panel, is disposed in the first region.

In an embodiment, the second region may further include a photo solder resist layer disposed on an upper surface of the first conductive layer, and the photo solder resist layer may be disposed in a same layer as the first layer.

In an embodiment, the second conductive layer may extend in the first region, the second conductive layer, the third conductive layer, and the fourth conductive layer may extend in the third region, the and first conductive layer and the fifth conductive layer may not be disposed in the first region and the third region.

An embodiment of a display device according to the invention includes: a display panel; a body unit; and a connection member which connects the display panel and the body unit to each other, where the connection member includes a first region, a second region, and a third region, the second region is positioned between the first region and the third region, a number of conductive layers in the second region is greater than a number of conductive layers in the first region and is greater a number of conductive layers in the third region. In such an embodiment, a first layer, which is an uppermost surface of the second region, extends to the third region, a second layer, which is a lowest surface of the third region, extends to the second region, and a side portion of the second region at a boundary between the second region and the third region is covered by the first layer and the second layer.

In an embodiment, the second region may include: a first conductive layer in contact with the first layer; a first insulating layer disposed opposite to the first layer with the first conductive layer therebetween; a fifth conductive layer in contact with the second layer; a fourth insulating layer disposed opposite to the second layer with the fifth conductive layer therebetween, where the first insulating layer and the fourth insulating layer may extend to the third region, a side portion of the first insulating layer may be covered by the first layer, and a side portion of the fourth insulating layer may be covered by the second layer.

In an embodiment, the second region may further include: a second conductive layer, a third conductive layer, and a fourth conductive; a second insulating layer disposed between the second conductive layer and the third conductive layer; and a third insulating layer disposed between the third conductive layer and the fourth conductive layer, where the first conductive layer to the fifth conductive layer may be connected to each other by a plurality of vias.

In an embodiment, the first layer may be one selected from an insulating layer including a black material, a shielding film, and a stacked member of the insulating layer including the black material and the shielding film.

In an embodiment, the second layer may be one selected from an insulating layer including a black material, a shielding film, and a stacked member of the insulating layer including the black material and the shielding film.

In an embodiment, the second region may be flexible.

In an embodiment, the second conductive layer may extend to the first region, the second conductive layer, the third conductive layer, and the fourth conductive layer may extend to the third region, and the first conductive layer and the fifth conductive layer may not be disposed in the first region and the third region.

In an embodiment, a pad part, which is connected to display panel, may be disposed in the first region.

According to embodiments of the connection member and the display device including the connection member, lifting and moisture permeation may be effectively prevented and aesthetics may be improved.

DETAILED DESCRIPTION

Figure 1:
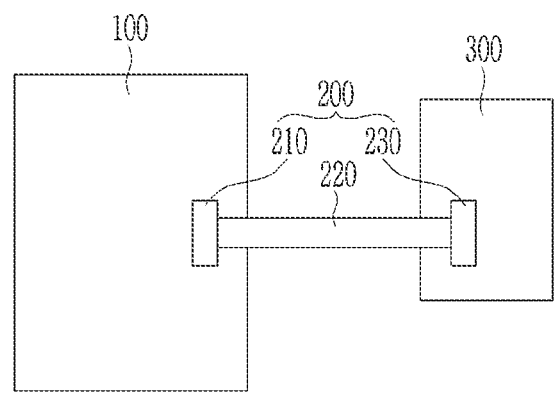
FIG. 1 is a view schematically showing a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, in the specification, the phrase "in a plan view" means when an object portion is viewed from above, and the phrase "in a cross-sectional view" means when a cross-section taken by vertically cutting an object portion is viewed from a side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a connection member and a display device including the connection member according to the invention will be described in detail with reference to accompanying drawings.

FIG. 1 is a view schematically showing a display device according to an embodiment. Referring to FIG. 1, an embodiment of a display device includes a display panel 100, a body unit 300, and a connection member 200 connecting the display panel 100 and the body unit 300 to each other.

The display panel 100 may display an image and may be an emissive display device including a light-emitting element. The body unit 300 may include a battery, etc., and may supply power or current to the display panel 100.

The connection member 200 connects the display panel 100 and the body unit 300 to each other, and may include a first region 210, a second region 220, and a third region 230.

The second region 220 may be positioned (or disposed) between the first region 210 and the third region 230. However, the invention is not limited thereto, and the connection member 200 may have a plurality of first regions 210, second regions 220, and third regions 230 positioned between the display panel 100 and the body unit 300 in various arrangement orders.

The connection member 200 may include a plurality of conductive layers to connect the display panel 100 and the body unit 300, and the number of conductive layers positioned in the first region 210, the second region 220, and the third region 230 may be different from each other. The connection member 200 may be flexible. The connection member 200 may be flexibly bent to connect the display panel 100 and the body unit 300.

Hereinafter, an embodiment of the connection member 200 according to the invention will be described in detail with reference to FIGS. 2 and 3.

Figure 2:
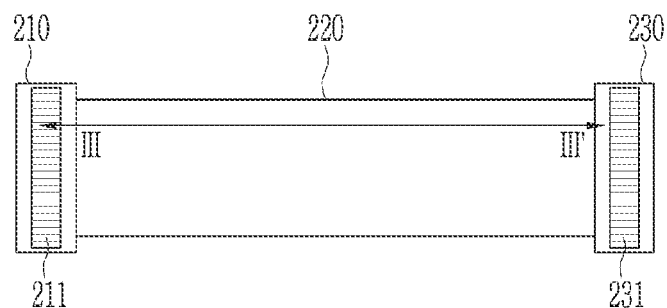
FIG. 2 is a view showing a connection member according to an embodiment.

FIG. 2 is a view showing a connection member 200 according to an embodiment. Referring to FIG. 2, an embodiment of the connection member 200 includes a first region 210, a second region 220, and a third region 230.

The first region 210 and the third region 230 may be connection units for connection with other constituent elements. A first pad part 211 may be positioned in the first region 210, and the first region 210 may be connected to the display panel 100 through the first pad part 211.

In such an embodiment, a third pad part 231 may be positioned in the third region 230, and the third region 230 may be connected to the body unit 300 through the third pad part 231.

The second region 220 is a region that connects the first region 210 and the third region 230 to each other. In such an embodiment, as will be described in detail later, the second region 220 may include a multi-layered conductive layer, in which the number of layers is greater than those of the first region 210 and the third region 230, such that the resistance of the connection member may be reduced.

However, FIG. 2 only shows a structure of one embodiment, and alternatively, the connection member 200 may be connected to and positioned in the order of the first region 210, the second region 220, the third region 230 and the second region 220, and may be connected to the display panel 100 in the first region 210 and may be connected to the body unit 300 in the second region 220 positioned on an outer edge. In such embodiments, the order of the arrangement of the first region 210, the second region 220, and the third region 230 in the connection member 200 may be variously modified.

Now, a detailed structure of an embodiment of the connection member 200 will be described below with reference to FIG. 3.

Figure 3:
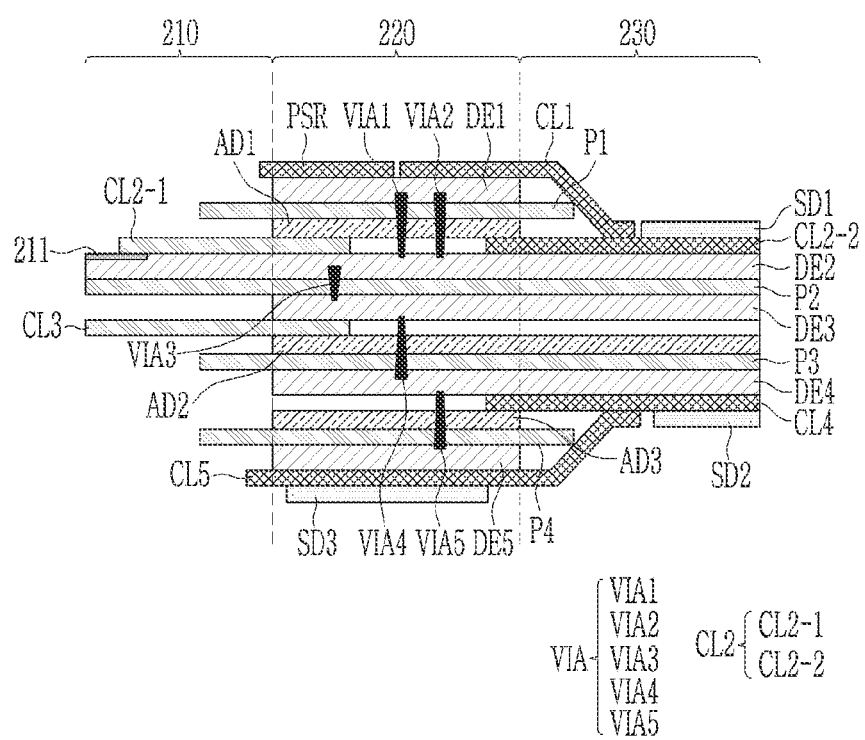
FIG. 3 is a cross-sectional view taken along line III-III' of FIG. 2 showing a connection member according to an embodiment.

FIG. 3 is a cross-sectional view taken along line III-III' of FIG. 2 showing a connection member according to an embodiment. FIG. 3 shows an embodiment including the first region 210, the second region 220, and the third region 230 as shown in FIG. 2.

Referring to FIG. 3, the second region 220 includes a first conductive layer DE1, a second conductive layer DE2, a third conductive layer DE3, a fourth conductive layer DE4, and a fifth conductive layer DE5. The first conductive layer DE1, the second conductive layer DE2, the third conductive layer DE3, the fourth conductive layer DE4, and the fifth conductive layer DE5 are sequentially stacked one on another, are insulated one from another by an insulating layer between, and are connected to each other through a plurality of vias VIA. In such an embodiment, each of the via VIA may include a conductive material.

In an embodiment, as shown in FIG. 3, a first via VIA1 and a second via VIA2 may connect the first conductive layer DE1 and the second conductive layer DE2 to each other. A third via VIA3 may connect the second conductive layer DE2 and the third conductive layer DE3 to each other. A fourth via VIA4 may connect the third conductive layer DE3 and the fourth conductive layer DE4 to each other. A fifth via VIA5 may connect the fourth conductive layer DE4 and the fifth conductive layer DE5 to each other.

In such an embodiment, since a plurality of conductive layers are positioned in the second region 220 and the plurality of conductive layers are connected through the vias, the resistance may be reduced in the second region 220.

In an embodiment, the first conductive layer DE1, the second conductive layer DE2, the third conductive layer DE3, the fourth conductive layer DE4, and the fifth conductive layer DE5 may include copper, for example, but are not limited thereto. In an embodiment, the first via VIA1 to the fifth via VIA5 may also include copper, for example, but are not limited thereto. In such an embodiment, the first conductive layer DE1, the second conductive layer DE2, the third conductive layer DE3, the fourth conductive layer DE4, and the fifth conductive layer DE5 may include a conductive material, and the first via VIA1 to the fifth via VIA5 may also include a conductive material. In an embodiment, the conductive layers in the second region 220 (e.g., the first to fifth conductive layers DE1 to DE5) and the vias the second region 220 (e.g., the first via VIA1 to the fifth via VIA5) may include a same material as each other or different materials from each other.

Referring to FIG. 3, the first conductive layer DE1 may be positioned in the second region 220 and may not be positioned in the first region 210 and third region 230.

A first insulating layer P1 may be positioned on one surface (e.g., an inner surface or a lower surface) of the first conductive layer DE1. The first insulating layer P1 may extend to and be positioned in the first region 210 and the third region 230.

A photo solder resist ("PSR") layer PSR may be positioned on an opposing surface (e.g., an outer surface or an upper surface) of the first conductive layer DE1, that is, the outermost of the second region 220. The PSR layer PSR may be formed by coating a PSR ink.

Referring to FIG. 3, the PSR layer PSR may be positioned in one region of the upper surface (or the outer surface) of the first conductive layer DE1, and a first cover layer CL1 may be positioned in another region of the outer surface of the first conductive layer DE1. The first cover layer CL1 may include a black material and may extend to the third region 230. In such an embodiment, the first cover layer CL1 may be positioned while covering a side portion of the first insulating layer P1 positioned on the third region 230. A further detailed configuration of the first cover layer CL1 will be described later.

The second conductive layer DE2 may extend to be positioned in all of the first region 210, the second region 220, and the third region 230. Referring to FIG. 3, the first pad part 211 may be positioned at one edge of the second conductive layer DE2 positioned in the first region 210.

A second cover layer CL2 may be positioned on one surface (e.g., an outer surface or an upper surface) of the second conductive layer DE2, and the second insulating layer P2 may be positioned on an opposing surface (e.g., an inner surface or a lower surface) of the second conductive layer DE2. The second insulating layer P2 may also be positioned in all of the first region 210, the second region 220, and the third region 230 in a same way as the second conductive layer DE2.

In an embodiment, the second cover layer CL2 may include a second-first cover layer CL2-1 and a second-second cover layer CL2-2, which are separated or spaced apart from each other. The second-first cover layer CL2-1 may be positioned in the first region 210 and extend to the second region 220, and the second-second cover layer CL2-2 may be positioned in the third region 230 and extend to the second region 220. In such an embodiment, the second-first cover layer CL2-1 may not overlap the first pad part 211 in the first region 210 and an upper surface of the first pad part 211 may be exposed. The first pad part 211 may be in contact with the display panel 100 as shown in FIG. 1.

The second-second cover layer CL2-2 may include a black material. The first cover layer CL1 may be positioned on the second-second cover layer CL2-2. In an embodiment, the first cover layer CL1, which is positioned on the first conductive layer DE1 and extends to the third region 230, may be positioned on the second-second cover layer CL2-2.

In an embodiment, as shown in FIG. 3, the first shielding film SD1 may be positioned in the third region 230 on the second-second cover layer CL2-2. The first shielding film SD1 may include Ag, for example, but is not limited thereto. The first shielding film SD1 may prevent electromagnetic interference ("EMI").

A first adhesive layer AD1 is positioned between the second cover layer CL2 and the first insulating layer P1, so that the second cover layer CL2 and the first insulating layer P1 may be attached to each other. In FIG. 3, a separation space between the second-first cover layer CL2-1 and the second-second cover layer CL2-2 is shown as an empty space for convenience of illustration, but the separation space between the second-first cover layer CL2-1 and the second-second cover layer CL2-2 may be actually filled with the first adhesive layer AD1.

The third conductive layer DE3 may be positioned in the second region 220 and the third region 230, the second insulating layer P2 may be positioned on one surface (e.g., an outer surface or an upper surface) of the third conductive layer DE3, and a third cover layer CL3 may be positioned on an opposing surface (an inner surface or a lower surface) of the third conductive layer DE3.

In an embodiment, as shown in FIG. 3, the third cover layer CL3 may be positioned in the first region 210 and the second region 220.

The fourth conductive layer DE4 may be positioned in the second region 220 and the third region 230. A third insulating layer P3 may be positioned on one surface (e.g., an inner surface or an upper surface) of the fourth conductive layer DE4, and a fourth cover layer CL4 may be positioned on an opposing surface (e.g., an outer surface or a lower surface) of the fourth conductive layer DE4. The third insulating layer P3 may be positioned in all of the first region 210, the second region 220, and the third region 230.

The third insulating layer P3 and the third cover layer CL3 may be attached with a second adhesive layer AD2. In FIG. 3, a space in the second region 220 and the third region 230 corresponding to the third cover layer CL3 in which the third cover layer CL3 is not positioned is shown as an empty space for convenience of illustration, but may actually be filled with the second adhesive layer AD2.

The fourth cover layer CL4 may be positioned in the second region 220 and the third region 230. The fourth cover layer CL4 may include a black material. The second shielding film SD2 may be positioned in the third region 230 on one surface (e.g., an outer surface or a lower surface) of the fourth cover layer CL4 positioned. The second shielding film SD2 may include Ag, for example, but is not limited thereto. The second shielding film SD2 may prevent EMI.

A fourth insulating layer P4 may be positioned on one surface (e.g., an inner surface or an upper surface) of the fifth conductive layer DE5, and a fifth cover layer CL5 may be positioned on an opposing surface (e.g., an outer surface or a lower surface) of the fifth conductive layer DE5.

The fifth conductive layer DE5 may be positioned only in the second region 220, and not in the first region 210 and the third region 230. The fourth insulating layer P4 may be positioned in both of the first region 210, the second region 220, and the third region 230. In such an embodiment, the fourth insulating layer P4 may extend further than the fifth conductive layer DE5.

The fourth insulating layer P4 and the fourth cover layer CL4 may be attached to each other by a third adhesive layer AD3 therebetween. In FIG. 3, a space corresponding the fourth cover layer CL4 in the second region 220 in which the fourth cover layer CL4 is not positioned is shown as an empty space for convenience of illustration, but may be filled with the third adhesive layer AD3. In such an embodiment, the fourth insulating layer P4 and the fourth conductive layer DE4 may be adhered to each other by the third adhesive layer AD3, and the fourth insulating layer P4 and the fourth cover layer CL4 may be adhered to each other.

The fifth cover layer CL5 may include a black material. The fifth cover layer CL5 may be positioned in the second region 220 and the third region 230, and may be in contact with the fourth cover layer CL4 in the third region 230. The fifth cover layer CL5 may be positioned while covering a side of the fourth insulating layer P4 positioned in the third region 230.

The third shielding film SD3 may be positioned in the second region 220 on one surface (e.g., an outer surface or a lower surface) of the fifth cover layer CL5. The third shielding film SD3 may include Ag, for example, but is not limited thereto, and may prevent EMI.

The first insulating layer P1 to the fourth insulating layer P4 may include a polyimide, for example, but are not limited thereto. The first cover layer CL1 to the fifth cover layer CL5 may also include a polyimide, for example, but are not limited thereto.

Among the first cover layer CL1 to the fifth cover layer CL5, the first cover layer CL1 and the fifth cover layer CL5 positioned on the opposing outermost sides of the second region 220 may include a black material. In such an embodiment, the second-second cover layer CL2-2 and the fourth cover layer CL4 positioned on the outermost side of the third region 230 may also include a black material.

In such an embodiment where a cover layer positioned on a outermost side of the connection member includes a black material, the inner conductive layer may not be visible from an outside. Referring to FIG. 3, the first insulating layer P1 is positioned and gradually protruded from the second region 220 to the first region 210 and the third region 230 to prevent an overflow of the first adhesive layer AD1. In such an embodiment, the fourth insulating layer P4 is also positioned and gradually protruded from the second region 220 to the first region 210 and the third region 230 to prevent an overflow of the third adhesive layer AD3.

In a connection member where the first insulating layer P1 and the fourth insulating layer P4 are protruded as described above, if the first insulating layer P1 and the fourth insulating layer P4 are exposed without being covered, the first insulating layer P1 and the fourth insulating layer P4 may be lifted or moisture may permeate thereto, thereby causing damage to the connection member. In addition, if the first insulating layer P1 and the fourth insulating layer P4 are not covered, the first insulating layer P1 and the fourth insulating layer P4 are visually recognized from the outside, so aesthetics of the connection member may be degraded.

In an embodiment of the display device according to the invention, a side of the first insulating layer P1 and the fourth insulating layer P4 is covered by the first cover layer CL1 and the fifth cover layer CL5, such hat the first insulating layer P1 and the fourth insulating layer P4 are not recognized from an outside and the first insulating layer P1 and the fourth insulating layer P4 may be effectively prevented from being lifted or moisture permeation to the first insulating layer P1 and the fourth insulating layer P4 may be effectively prevented by being covered by the first cover layer CL1 and the fifth cover layer CL5. In FIG. 3, although the first cover layer CL1 is shown to not be in contact with the upper surface of the first insulating layer P1, in such an embodiment, the first cover layer CL1 may be positioned while in contact with one surface (e.g., an outer surface or an upper surface) of the first insulating layer P1. In such an embodiment, the fifth cover layer CL5 may be positioned in contact with one surface (e.g., an outer surface of a lower surface) of the fourth insulating layer P4.

In an embodiment, as shown in FIG. 2 and FIG. 3, a boundary between the first region 210 and the second region 220 may be obscured by the display panel 100 and thus may not be recognized from the outside. At the boundary between the first region 210 and the second region 220, the first insulating layer P1 and the fourth insulating layer P4 are not exposed, and thus, undesired issues of the lifting and the moisture permeation due to the exposure may not occur. Therefore, in an embodiment, the protruded first insulating layer P1 and the fourth insulating layer P4 are covered by the cover layers CL1 and CL5 including the black material at the boundary between the second region 220 and the third region 230, and may not cover at the boundary between the first region 210 and the second region 220.

Hereinafter, various alternative embodiments of the connection members according to the invention will be described.

Figure 4:
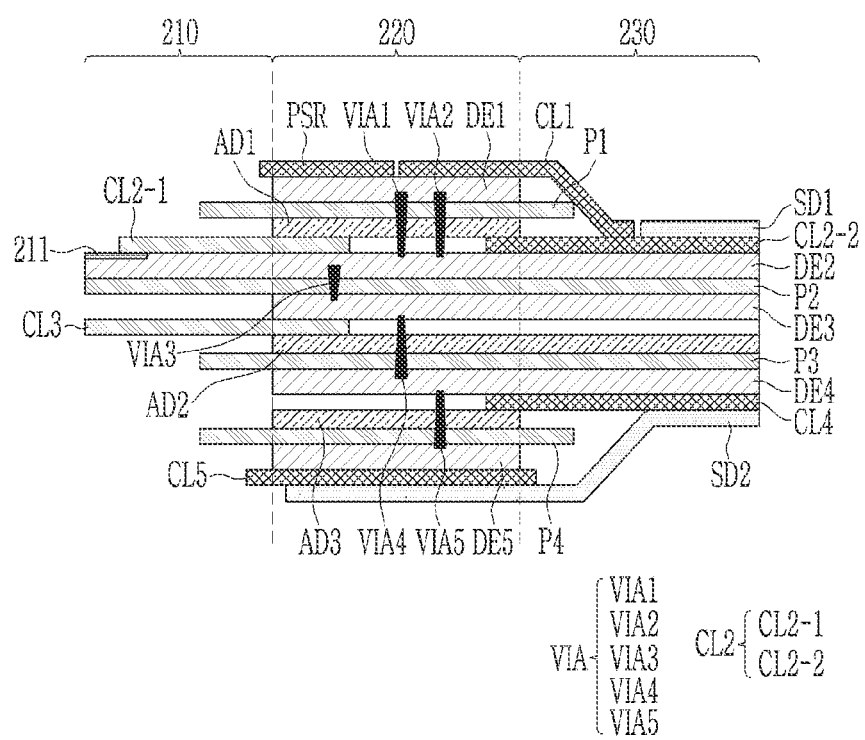
FIG. 4 is a cross-sectional view corresponding to FIG. 3 showing a connection member according to an alternative embodiment.

FIG. 4 is a cross-sectional view corresponding to FIG. 3 showing a connection member according to an alternative embodiment.

The embodiment of the connection member of FIG. 4 is substantially the same as the embodiment of FIG. 3, except for the shape of the fifth cover layer CL5 and the second shielding film SD2. The same or like elements shown in FIG. 4 have been labeled with the same reference characters as used above to describe the embodiment of the connection member shown in FIG. 3, and any repetitive detailed description thereof will hereinafter be omitted or simplified.

Referring to FIG. 4, in an embodiment, the fifth cover layer CL5 is not in contact with the fourth cover layer CL4. In such an embodiment, the second shielding film SD2 positioned in the third region 230 extends to the second region 220 and is in contact with the fifth cover layer CL5 in the second region 220. In such an embodiment, the side of the fourth insulating layer P4 is covered by the second shielding film SD2 instead of the fifth cover layer CL5. In such an embodiment, while improving the shielding performance, the fourth insulating layer P4 may be prevented from being recognized from the outside.

Figure 5:
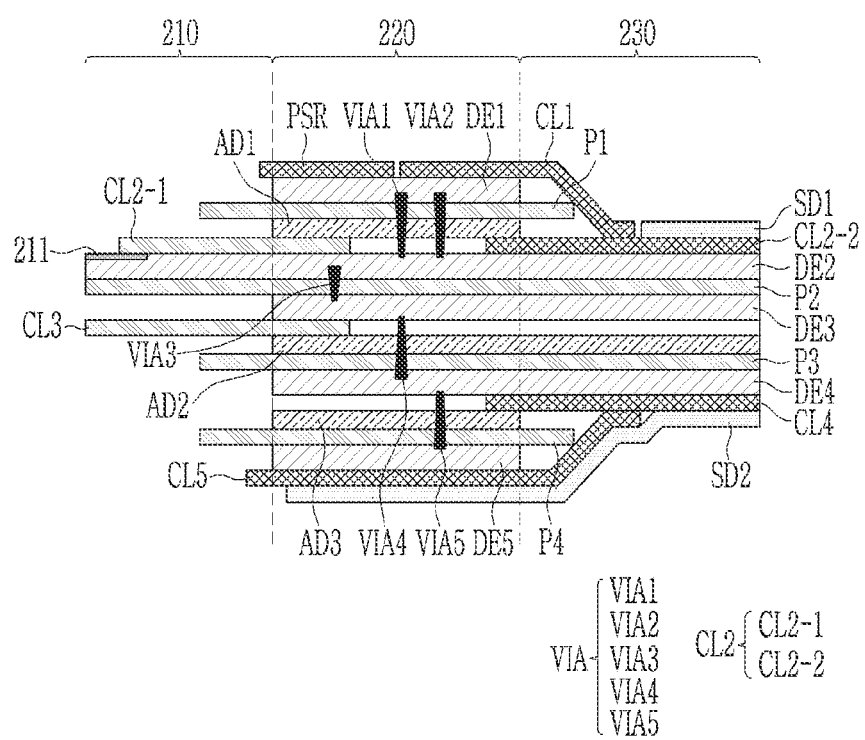
FIG. 5 is a cross-sectional view corresponding to FIG. 3 showing a connection member according to another alternative embodiment.

FIG. 5 is a cross-sectional view corresponding to FIG. 3 showing a connection member according to another alternative embodiment.

The embodiment of the connection member of FIG. 5 is substantially the same as the embodiment of FIG. 3 except for the shape of the second shielding film SD2. The same or like elements shown in FIG. 5 have been labeled with the same reference characters as used above to describe the embodiment of the connection member shown in FIG. 3, and any repetitive detailed description thereof will hereinafter be omitted or simplified.

Referring to FIG. 5, in an embodiment of the connection member, the second shielding film SD2 extends to the second region 220 and is in contact with the fifth cover layer CL5 in the second region 220. The second shielding film SD2 extending to the third region 230 is in contact with the fourth cover layer CL4 in the third region 230. In such an embodiment, the fourth insulating layer P4 is firstly covered by the fifth cover layer CL5 and secondly covered by the second shielding film SD2. Therefore, moisture permeation of the fourth insulating layer P4 may be further prevented. In such an embodiment, since the second shielding film SD2 is positioned in a wide area along the second region 220 and the third region 230, the shielding performance thereof may be further improved.

Figure 6:
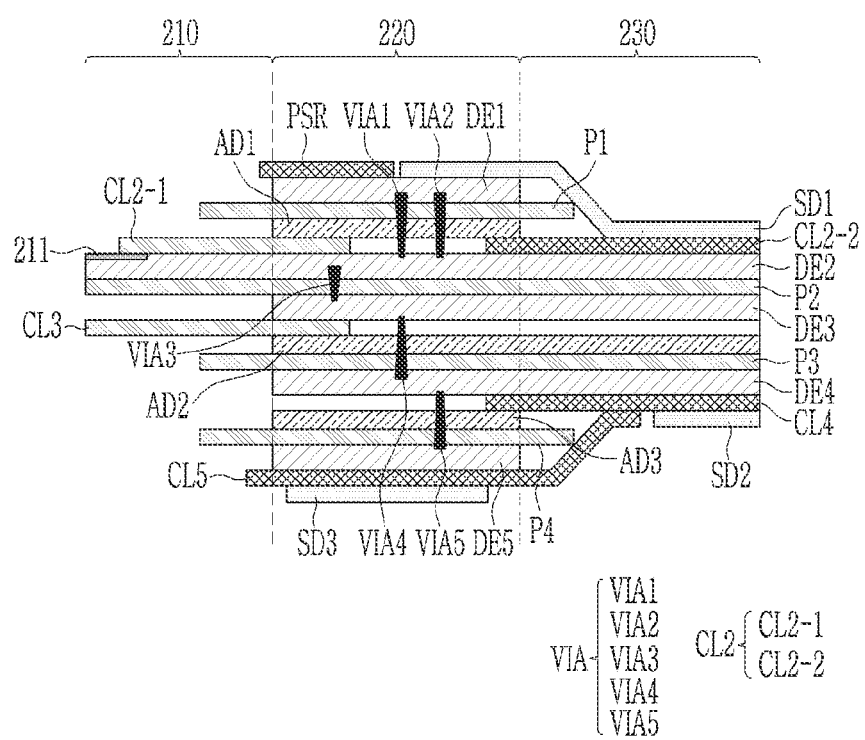
FIG. 6 is a cross-sectional view corresponding to FIG. 3 showing a connection member according to another alternative embodiment.

FIG. 6 is a cross-sectional view corresponding to FIG. 3 showing a connection member according to another alternative embodiment.

The embodiment of the connection member of FIG. 6 is substantially the same as the embodiment of FIG. 3 except for the configuration of the first cover layer CL1 and the first shielding film SD1. The same or like elements shown in FIG. 6 have been labeled with the same reference characters as used above to describe the embodiment of the connection member shown in FIG. 3, and any repetitive detailed description thereof will hereinafter be omitted or simplified.

Referring to FIG. 6, an embodiment of the connection member according may not include the first cover layer CL1. In such an embodiment, the first shielding film SD1 covers the first insulating layer P1 while extending from the third region 230 to the second region 220. The first shielding film SD1 may be in direct contact with the first conductive layer DE1 in the second region 220. In such an embodiment, while improving the shielding performance, the first insulating layer P1 may be prevented from being recognized from the outside.

Figure 7:
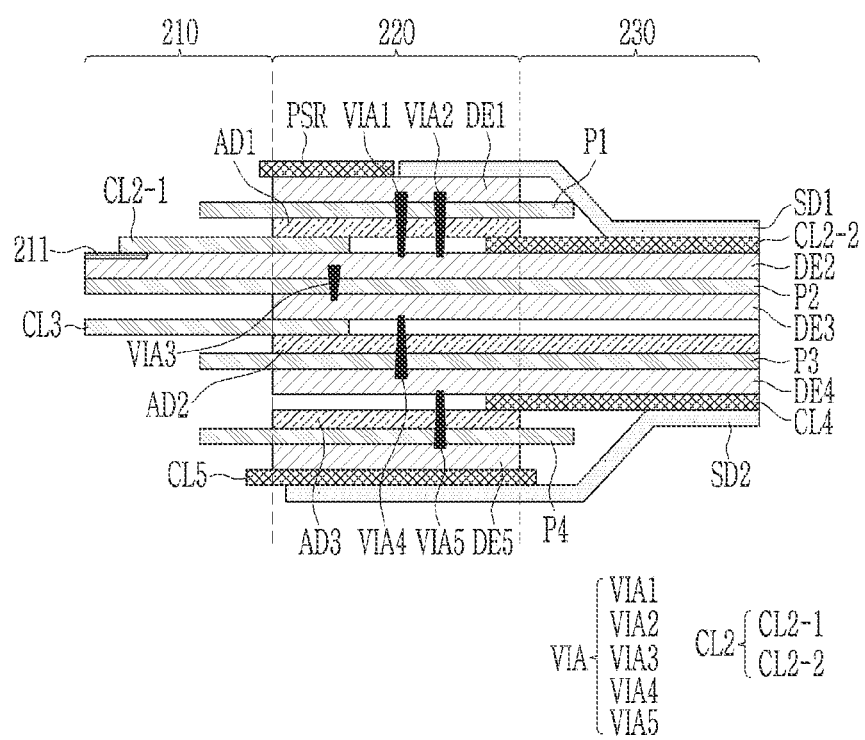
FIG. 7 is a cross-sectional view corresponding to FIG. 4 showing a connection member according to another alternative embodiment.

FIG. 7 is a cross-sectional view corresponding to FIG. 4 showing a connection member according to another alternative embodiment.

The embodiment of the connection member of FIG. 7 is substantially the same as the embodiment of FIG. 4 except for the configuration of the first cover layer CL1 and the first shielding film SD1. The same or like elements shown in FIG. 7 have been labeled with the same reference characters as used above to describe the embodiment of the connection member shown in FIG. 4, and any repetitive detailed description thereof will hereinafter be omitted or simplified.

In an embodiment, as shown in FIG. 7, the connection member may not include the first cover layer CL1 as in the embodiment of FIG. 6. In such an embodiment, the first shielding film SD1 covers the first insulating layer P1 while extending from the third region 230 to the second region 220. The first shielding film SD1 may be in direct contact with the first conductive layer DE1 in the second region 220. In such an embodiment, while improving the shielding performance, the first insulating layer P1 may be prevented from being recognized from the outside.

Figure 8:
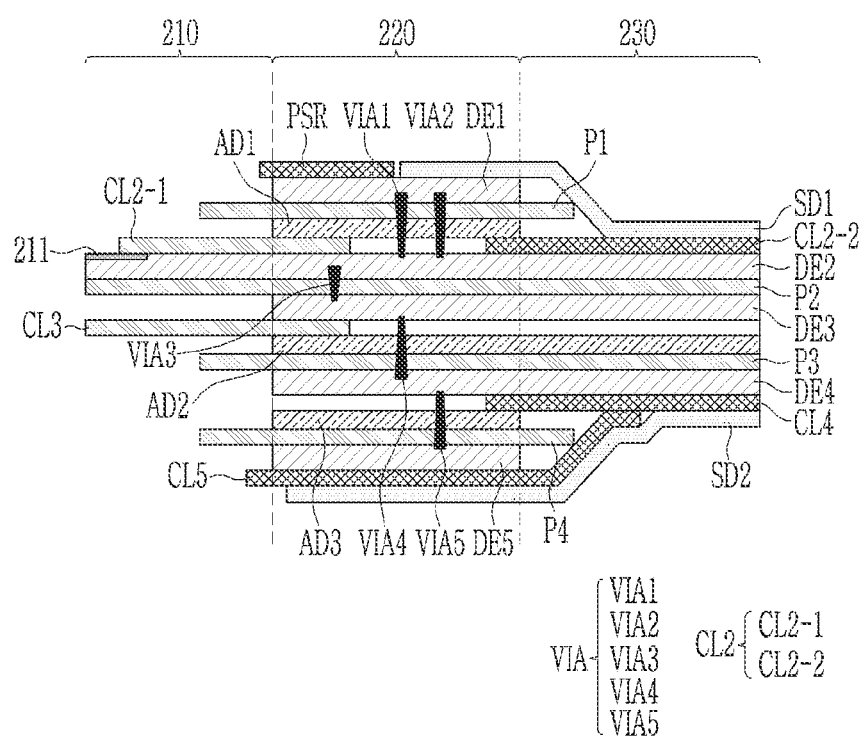
FIG. 8 is a cross-sectional view corresponding to FIG. 5 showing a connection member according to another alternative embodiment.

FIG. 8 is a cross-sectional view corresponding to FIG. 5 showing a connection member according to another alternative embodiment.

The embodiment of the connection member of FIG. 8 is substantially the same as the embodiment of FIG. 5 except for the configuration of the first cover layer CL1 and the first shielding film SD1. The same or like elements shown in FIG. 8 have been labeled with the same reference characters as used above to describe the embodiment of the connection member shown in FIG. 5, and any repetitive detailed description thereof will hereinafter be omitted or simplified.

In an embodiment, as shown in FIG. 8, the first cover layer CL1 is not included as in the embodiment of FIG. 6. In such an embodiment, the first shielding film SD1 covers the first insulating layer P1 while extending from the third region 230 to the second region 220. The first shielding film SD1 may be in direct contact with the first conductive layer DE1 in the second region 220. In such an embodiment, while improving the shielding performance, the first insulating layer P1 may be prevented from being recognized from the outside.

Figure 9:
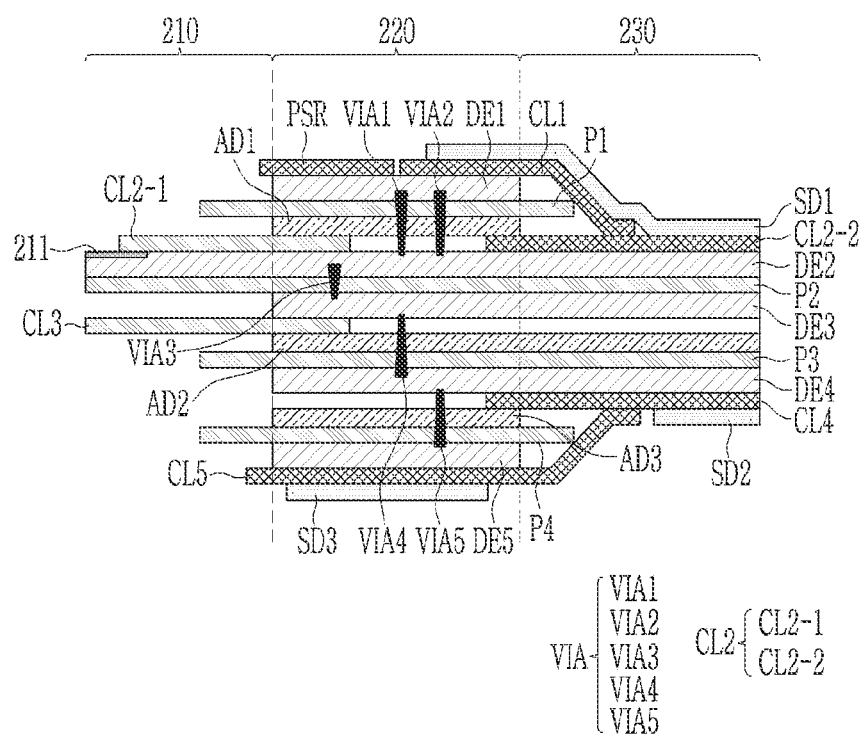
FIG. 9 is a cross-sectional view corresponding to FIG. 3 showing a connection member according to another alternative embodiment.

FIG. 9 is a cross-sectional view corresponding to FIG. 3 showing a connection member according to another alternative embodiment.

The embodiment of the connection member of FIG. 9 is substantially the same as the embodiment of FIG. 3 except for the configuration of the first shielding film SD1. The same or like elements shown in FIG. 9 have been labeled with the same reference characters as used above to describe the embodiment of the connection member shown in FIG. 3, and any repetitive detailed description thereof will hereinafter be omitted or simplified.

Referring to FIG. 9, in an embodiment of the connection member, the first shielding film SD1 is positioned in the first cover layer CL1 and is also positioned in the second region 220. In such an embodiment, the first insulating layer P1 is firstly covered by the first cover layer CL1 and secondly covered by the first shielding film SD1. Therefore, the first insulating layer P1 may be further prevented from the moisture permeation, and the shielding performance may be improved since the first shielding film SD1 is positioned in a wide area along the second region 220 and the third region 230.

Figure 10:
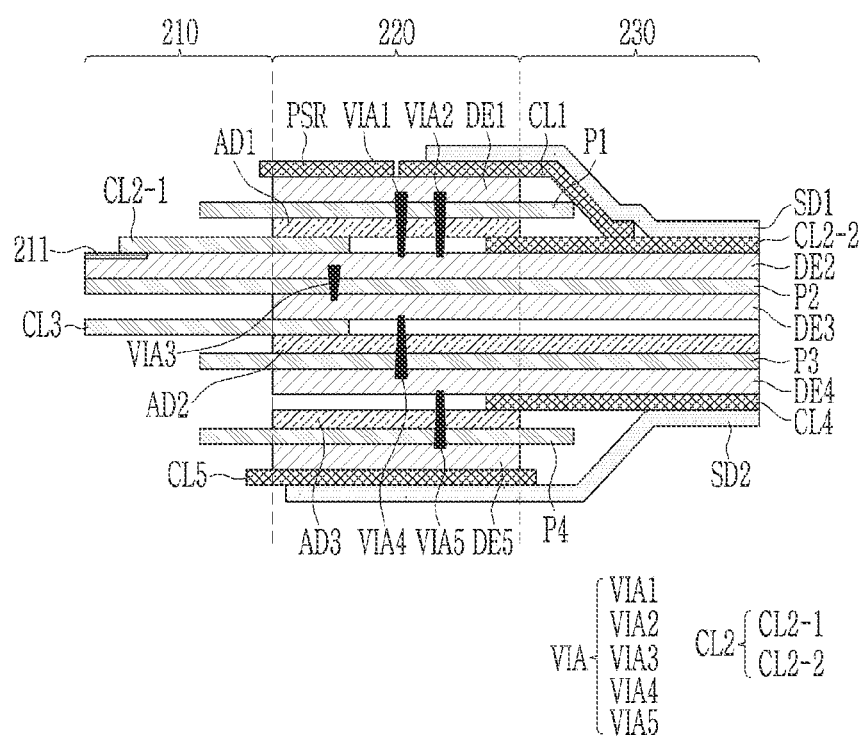
FIG. 10 is a cross-sectional view corresponding to FIG. 4 showing a connection member according to another alternative embodiment.

FIG. 10 is a cross-sectional view corresponding to FIG. 4 showing a connection member according to another alternative embodiment.

The embodiment of the connection member of FIG. 10 is substantially the same as the embodiment of FIG. 4 except for the configuration of the first shielding film SD1. The same or like elements shown in FIG. 10 have been labeled with the same reference characters as used above to describe the embodiment of the connection member shown in FIG. 4, and any repetitive detailed description thereof will hereinafter be omitted or simplified.

In an embodiment, as shown in FIG. 10, the first shielding film SD1 is positioned on the first cover layer CL1 and is also positioned in the second region 220 as in the embodiment of FIG. 9. In such an embodiment, the first insulating layer P1 is firstly covered by the first cover layer CL1 and secondly covered by the first shielding film SD1. Therefore, the first insulating layer P1 may be further prevented from the moisture permeation, and the shielding performance may be improved since the first shielding film SD1 is positioned in a wide area along the second region 220 and the third region 230.

Figure 11:
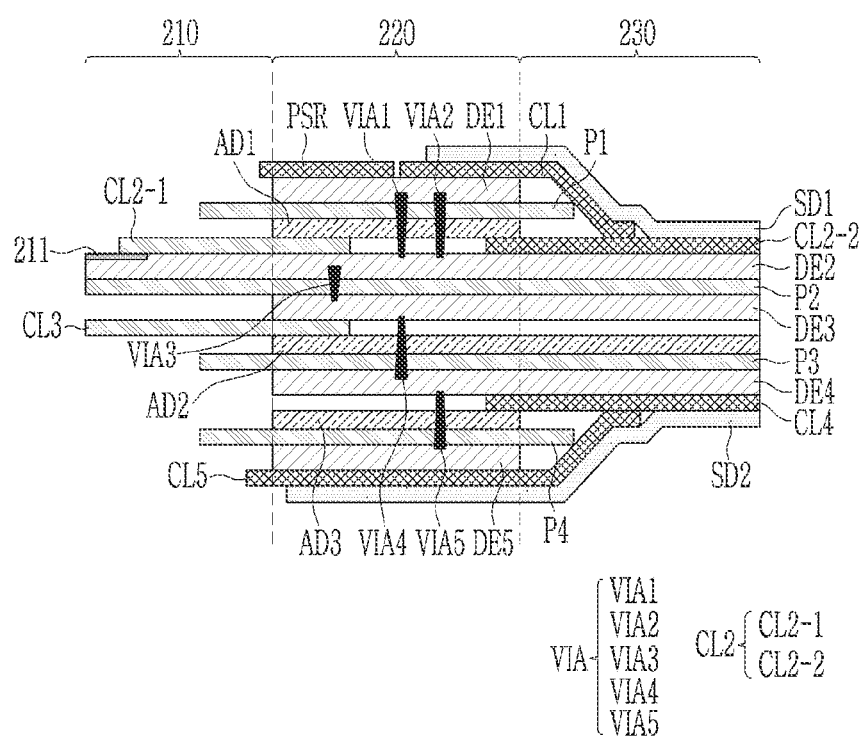
FIG. 11 is a cross-sectional view corresponding to FIG. 5 showing a connection member according to another alternative embodiment.

FIG. 11 is a cross-sectional view corresponding to FIG. 5 showing a connection member according to another alternative embodiment.

The embodiment of the connection member of FIG. 11 is substantially the same as the embodiment of FIG. 5 except for the configuration of the first shielding film SD1. The same or like elements shown in FIG. 11 have been labeled with the same reference characters as used above to describe the embodiment of the connection member shown in FIG. 5, and any repetitive detailed description thereof will hereinafter be omitted or simplified.

In an embodiment, as shown in FIG. 11, the first shielding film SD1 is positioned on the first cover layer CL1 and is also positioned in the second region 220 as in the embodiments of FIG. 9 and FIG. 10. In such an embodiment, the first insulating layer P1 is firstly covered by the first cover layer CL1 and secondly covered by the first shielding film SD1. Therefore, the first insulating layer P1 may be further prevented from the moisture permeation, and the shielding performance may be improved since the first shielding film SD1 is positioned in a wide area along the second region 220 and the third region 230.

Figure 12:
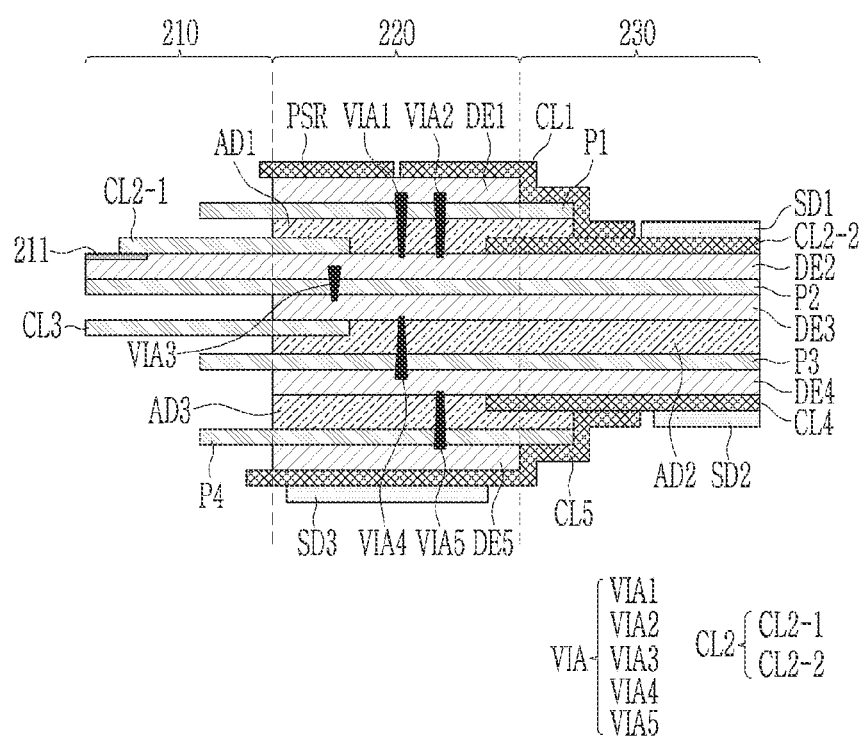
FIG. 12 is a cross-sectional view corresponding to FIG. 3 showing a connection member according to another alternative embodiment.

FIG. 12 is a cross-sectional view corresponding to FIG. 3 showing a connection member according to another alternative embodiment. FIG. 3 to FIG. 11 show embodiments in which a separation space (or an empty space) may be defined between layers of the connection member. such separation space may allow the connection member to be flexibly bent. In another alternative embodiment, as shown in FIG. 12, no separation space is defined between the layers of the connection member, and may be filled with an adhesive layer or the like.

The embodiment of FIG. 12 is substantially the same as the embodiment of FIG. 3 except for a separation region. In such an embodiment, as shown in FIG. 12, the separation space is not defined between the layers of the second region 220 and the third region 230, and may be filled with a first adhesive layer AD1, a second adhesive layer AD2, and a third adhesive layer AD3.

In such an embodiment, the first cover layer CL1 may be positioned in the third region 230 while covering the upper surface of the first insulating layer P1. In such an embodiment, the fifth cover layer CL5 may be positioned in the third region 230 while covering the upper surface of the fourth insulating layer P4.

FIG. 12 shows an embodiment having a structure in which the separation space is filed with the adhesive layer for the embodiment of the FIG. 3, and such modifications may be also be applied to the embodiments of FIG. 4 to FIG. 11.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A connection member comprising
   a first region, a second region, and a third region,
   a first conductive layer,
   a second conductive layer,
   a third conductive layer,
   a first insulating layer disposed between the first conductive layer and the second conductive layer,
   a second insulating layer disposed between the second conductive layer and the third conductive layer, and
   a cover layer overlapped the second region and the third region,
   wherein the second region overlapped the first conductive layer, the second conductive layer, the third conductive layer, the first insulating layer and the second insulating layer,
   wherein the third region dose not overlapped the first conductive layer and the third conductive layer,
   wherein the third region overlapped an edge of the first insulating layer and an edge of the second insulating layer,
   the edge of the first insulating layer and the edge of the second insulating layer are covered by the cover layer.

2. The connection member of claim 1,
   the cover layer includes a first layer, which is an uppermost layer of the second region, extends to the third region,
   a second layer, which is a lowermost layer of the third region, extends to the second region.

3. The connection member of claim 2, wherein
   the first layer is an insulating layer including a black material.

4. The connection member of claim 3, wherein
   the second layer is one selected from an insulating layer including a black material, a shielding film, and a stacked structure of the insulating layer including the black material and the shielding film.

5. The connection member of claim 2, wherein
   the first layer is a shielding film.

6. The connection member of claim 5, wherein
   the second layer is one selected from an insulating layer including a black material, a shielding film, and a stacked structure of the insulating layer including the black material and the shielding film.

7. The connection member of claim 2, wherein
   the first layer is a stacked structure of an insulating layer including a black material and a shielding film.

8. The connection member of claim 7, wherein
   the second layer is one selected from an insulating layer including a black material, a shielding film, and a stacked structure of the insulating layer including the black material and the shielding film.

9. The connection member of claim 2, wherein the second region further includes:
   a photo solder resist layer disposed on an upper surface of the first conductive layer,
   wherein the photo solder resist layer is disposed in a same layer as the first layer.

10. The connection member of claim 1,
    wherein no other layer is disposed between the edge of the first insulating layer and the cover layer.

11. The connection member of claim 1,
    wherein a number of conductive layers in the second region is greater than a number of conductive layers in the first region and is greater than a number of conductive layers in the third region.

12. The connection member of claim 1, wherein
    a pad part, which is connected to a panel, is disposed in the first region.

13. The connection member of claim 1, wherein
    the second conductive layer extends in the first region.

14. The connection member of claim 1, wherein
    the second conductive layer extends in the third region.

15. The connection member of claim 1, further comprising
    a fourth conductive layer and
    a fifth conductive layer,
    wherein the second region overlapped the fourth conductive layer and the fifth conductive layer and
    the third region overlapped the fourth conductive layer and the fifth conductive layer.

16. A display device comprising:
    a display panel;
    a body unit; and
    a connection member which connects the display panel and the body unit to each other,
    wherein the connection member includes a first region, a second region, and a third region,
    a first conductive layer,
    a second conductive layer,
    a third conductive layer,
    a first insulating layer disposed between the first conductive layer and the second conductive layer,
    a second insulating layer disposed between the second conductive layer and the third conductive layer, and a cover layer overlapped the second region and the third region, the second region overlapped the first conductive layer, the second conductive layer, the third conductive layer, the first insulating layer and the second insulating layer, the third region dose not overlapped the first conductive layer and the third conductive layer, the third region overlapped an edge of the first insulating layer and an edge of the second insulating layer, the edge of the first insulating layer and the edge of the second insulating layer are covered by the cover layer.

17. The display device of claim 16, the cover layer includes a first layer, which is an uppermost layer of the second region, extends to the third region, a second layer, which is a lowermost layer of the third region, extends to the second region.

18. The display device of claim 17,

Wherein the first layer is an insulating layer including a black material.

19. The display device of claim 18, wherein the second layer is one selected from an insulating layer including a black material, a shielding film, and a stacked structure of the insulating layer including the black material and the shielding film.

20. The display device of claim 17, wherein the first layer is a shielding film.

21. The display device of claim 20, wherein the second layer is one selected from an insulating layer including a black material, a shielding film, and a stacked structure of the insulating layer including the black material and the shielding film.

22. The display device of claim 17, wherein the first layer is a stacked structure of an insulating layer including a black material and a shielding film.

23. The display device of claim 22, wherein the second layer is one selected from an insulating layer including a black material, a shielding film, and a stacked structure of the insulating layer including the black material and the shielding film.

24. The display device of claim 17, wherein the second region further includes:

a photo solder resist layer disposed on an upper surface of the first conductive layer, wherein the photo solder resist layer is disposed in a same layer as the first layer.

25. The display device of claim 16, wherein no other layer is disposed between the edge of the first insulating layer and the cover layer.

26. The display device of claim 16, wherein a number of conductive layers in the second region is greater than a number of conductive layers in the first region and is greater than a number of conductive layers in the third region.

27. The display device of claim 16, wherein a pad part, which is connected to a panel, is disposed in the first region.

28. The display device of claim 16, wherein the second conductive layer extends in the first region.

29. The display device of claim 16, wherein the second conductive layer extends in the third region.

30. The display device of claim 16, further comprising a fourth conductive layer and a fifth conductive layer, wherein the second region overlapped the fourth conductive layer and the fifth conductive layer and the third region overlapped the fourth conductive layer and the fifth conductive layer.

* * * * *